United States Patent
Nakamura

(10) Patent No.: US 12,308,293 B2
(45) Date of Patent: May 20, 2025

(54) METHOD OF PROCESSING WAFER

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 417 days.

(21) Appl. No.: 17/809,747

(22) Filed: Jun. 29, 2022

(65) Prior Publication Data

US 2023/0023820 A1 Jan. 26, 2023

(30) Foreign Application Priority Data

Jul. 21, 2021 (JP) .................................. 2021-120208

(51) Int. Cl.
| | |
|---|---|
| H01L 21/78 | (2006.01) |
| H01L 21/304 | (2006.01) |
| H01L 21/3105 | (2006.01) |
| H01L 21/56 | (2006.01) |

(52) U.S. Cl.
CPC ............ *H01L 21/78* (2013.01); *H01L 21/304* (2013.01); *H01L 21/31053* (2013.01); *H01L 21/56* (2013.01)

(58) Field of Classification Search
None
See application file for complete search history.

(56) References Cited

U.S. PATENT DOCUMENTS

| | | | |
|---|---|---|---|
| 2008/0176491 A1 | 7/2008 | Sekiya | |
| 2012/0080138 A1* | 4/2012 | Yew | ...................... H01L 21/304 |
| | | | 156/247 |
| 2012/0235282 A1* | 9/2012 | Tomono | .............. H01L 23/3114 |
| | | | 257/618 |
| 2017/0186645 A1* | 6/2017 | Lu | ........................... H01L 21/78 |
| 2021/0146476 A1 | 5/2021 | Kwon et al. | |

FOREIGN PATENT DOCUMENTS

| | | | |
|---|---|---|---|
| CN | 102886829 | * | 1/2013 |
| JP | 11040520 A | | 2/1999 |
| JP | 2013021017 A | | 1/2013 |
| JP | 2014078569 A | | 5/2014 |

OTHER PUBLICATIONS

Office Action issued in counterpart German patent application No. 10 2022 207 198.0, dated May 22, 2024.

* cited by examiner

*Primary Examiner* — Asok K Sarkar
(74) *Attorney, Agent, or Firm* — Greer Burns & Crain Ltd.

(57) ABSTRACT

A method of processing a wafer having a plurality of devices formed in respective areas on a face side of the wafer, the areas being demarcated by a plurality of intersecting projected dicing lines, includes a resin applying step of coating the face side of the wafer with a liquid resin to cover an area of the wafer where the plurality of devices are present, a resin curing step of curing the liquid resin into a protective film, a protective tape laying step of laying a protective tape on an upper surface of the protective film, and a planarizing step of planarizing a face side of the protective tape.

6 Claims, 8 Drawing Sheets

FIG.5A
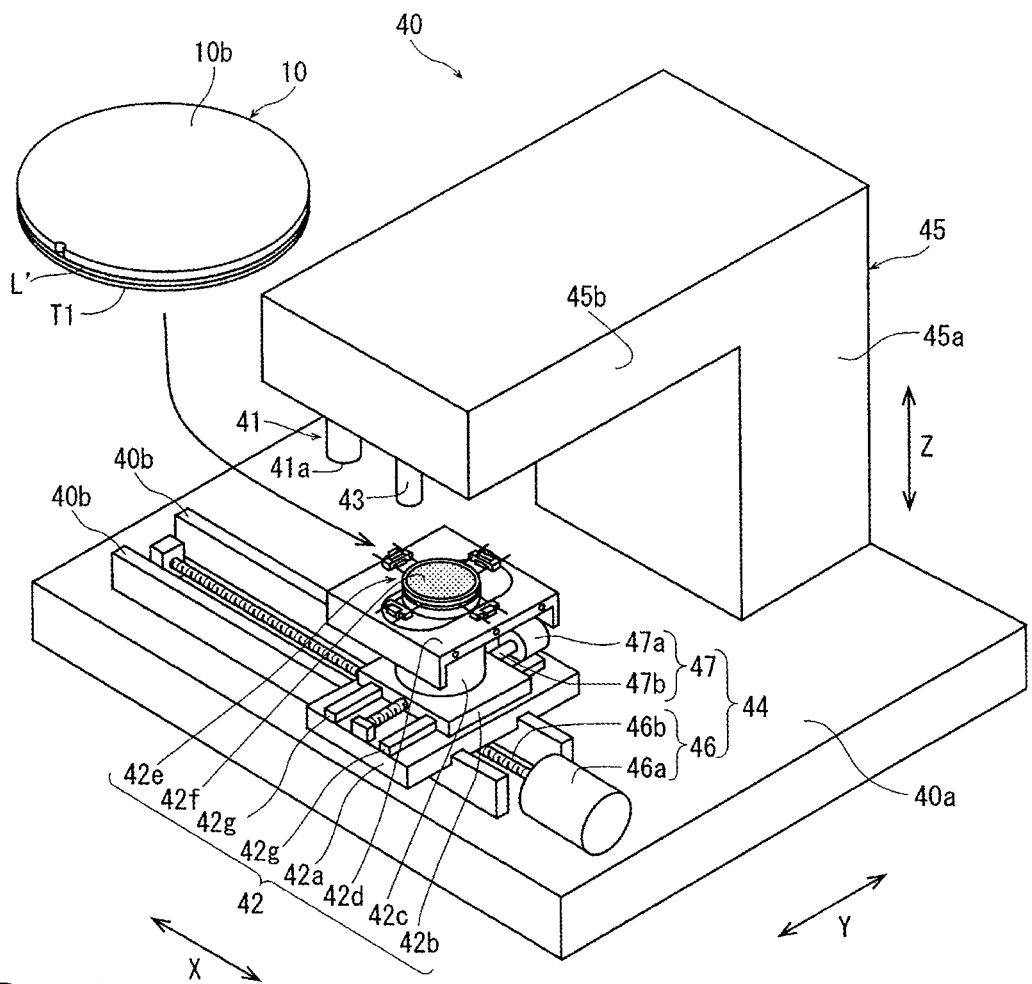
FIG.5B
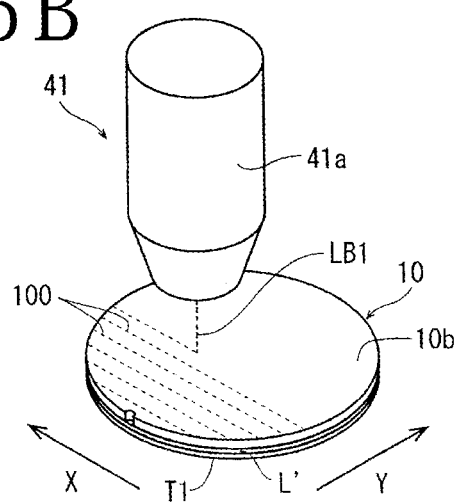
FIG.5C

FIG.11A
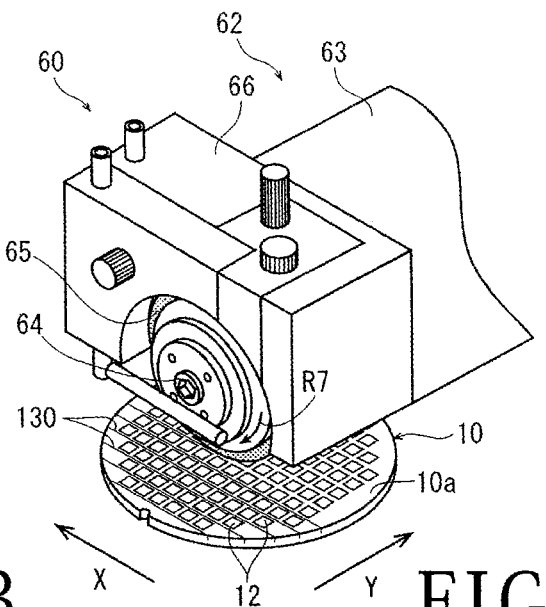
FIG.11B
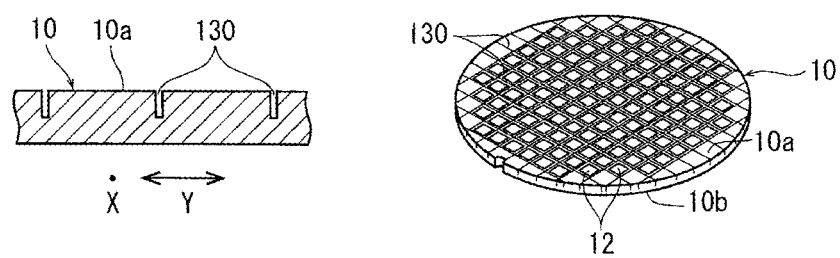
FIG.11C
FIG.12
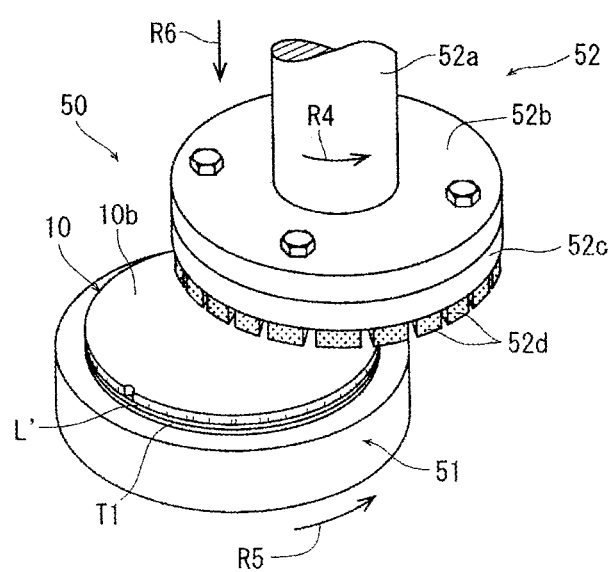

METHOD OF PROCESSING WAFER

BACKGROUND OF THE INVENTION

Field of the Invention

The present invention relates to a method of processing a wafer having a plurality of devices formed in respective areas on a face side of the wafer, the areas being demarcated by a plurality of intersecting projected dicing lines established thereon.

Description of the Related Art

Wafers with a plurality of devices such as integrated circuits (ICs) or large-scale integrated (LSI) circuits formed in respective areas on a face side of the wafer, the areas being demarcated by a plurality of intersecting projected dicing lines established thereon, are divided by a dicing apparatus into individual device chips. The divided device chips are used in electric appliances such as mobile phones and personal computers.

There has been proposed in the art a technology for applying a laser beam whose wavelength is transmittable through a wafer to the wafer while positioning the focused spot of the laser beam within the wafer at positions aligned with projected dicing lines on a face side of the wafer, thereby forming modified layers in the wafer, thereafter grinding a reverse side of the wafer to thin down the wafer to a desired thickness, and then dividing the wafer into individual device chips at the modified layers along the projected dicing lines (see, for example, JP 2014-078569A).

There has also been proposed in the art a technology for forming grooves in a wafer along projected dicing lines established on a face side of the wafer, then laying a protective tape on the face side of the wafer, and grinding a reverse side of the wafer with grindstones to finish the wafer to a predetermined thickness and expose the grooves on the reverse side, thereby dividing the wafer into individual device chips (see, for example, JP 1999-040520A).

SUMMARY OF THE INVENTION

Some wafers have devices formed thereon that include surface irregularities on face sides thereof, i.e., protrusive electrodes, called "bumps," for example. If such a wafer is processed according to the technology disclosed in JP 2014-078569A, then the wafer may be broken due to the bumps.

The technology disclosed in JP 1999-040520A as applied to a wafer with bumps as described above is problematic in that it is difficult to grind the reverse side of the wafer to divide the wafer properly into individual device chips without causing damage to the wafer.

It is therefore an object of the present invention to provide a method of processing a wafer that has protrusions on a face side thereof to divide the wafer into individual device chips without breaking or damaging the wafer.

In accordance with an aspect of the present invention, there is provided a method of processing a wafer having a plurality of devices formed in respective areas on a face side of the wafer, the areas being demarcated by a plurality of intersecting projected dicing lines, the method including a resin applying step of coating the face side of the wafer with a liquid resin to cover an area of the wafer where the plurality of devices are present, a resin curing step of curing the liquid resin into a protective film, a protective tape laying step of laying a protective tape on an upper surface of the protective film, and a planarizing step of planarizing a face side of the protective tape.

Preferably, the planarizing step includes the steps of holding a reverse side of the wafer on a chuck table, exposing the face side of the wafer, and cutting the protective tape to planarize the protective tape with a cutting unit having a single-point cutting tool.

Preferably, the method further includes a modified layer forming step of forming modified layers in the wafer along the respective projected dicing lines by applying a laser beam having a wavelength transmittable through the wafer to the wafer from the reverse side of the wafer along the projected dicing lines while positioning a focused spot of the laser beam within the wafer, and a dividing step of grinding the reverse side of the wafer with grindstones to finish the wafer to a predetermined thickness and dividing the wafer into individual device chips along the modified layers. Preferably, the method further includes a grinding step of grinding the reverse side of the wafer with grindstones to finish the wafer to a predetermined thickness, a modified layer forming step of forming modified layers in the wafer along the respective projected dicing lines by applying a laser beam having a wavelength transmittable through the wafer to the wafer from the reverse side of the wafer along the projected dicing lines while positioning a focused spot of the laser beam within the wafer, and a dividing step of dividing the wafer into individual device chips by exerting external forces to the wafer.

Preferably, the method further includes a groove forming step of, before the resin applying step, forming grooves in the wafer along the respective projected dicing lines on the face side of the wafer. The resin applying step, the resin curing step, the protective tape laying step, and the planarizing step may be carried out after the groove forming step. A dividing step of grinding the reverse side of the wafer with grindstones to finish the wafer to a predetermined thickness and expose the grooves on the reverse side, to thereby divide the wafer into individual device chips may be carried out after the planarizing step.

With the method of processing a wafer according to the present invention, even if protrusions such as bumps are present on the face side of the wafer, the protrusions can be embedded in the liquid resin. Since the protective tape that covers the protective film has its face side planarized, surface irregularities of the protective film and undulations due to thickness variations of the protective tape are eliminated, and the reverse side of the wafer can be ground by the grindstones to divide the wafer properly into individual device chips without causing damage to the wafer.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 5A is a perspective view of a laser processing apparatus;

FIG. 5B is a perspective view illustrating the manner in which a modified layer forming step is carried out;

FIG. 5C is a cross-sectional view of a wafer illustrated in FIG. 5B;

FIG. 11A is a perspective view illustrating the manner in which a groove forming step is carried out;

FIG. 11B is an enlarged fragmentary cross-sectional view of the wafer illustrated in FIG. 11A;

FIG. 11C is a perspective view of the wafer in which grooves have been formed in the groove forming step;

FIG. 12 is a perspective view illustrating the manner in which a dividing step of grinding the reverse side of the wafer by grindstones to divide the wafer into individual device chips is carried out;

DETAILED DESCRIPTION OF THE PREFERRED EMBODIMENT

A method of processing a wafer as a workpiece according to a preferred embodiment of the present invention will be described in detail hereinbelow with reference to the drawings.

Figure 1A:
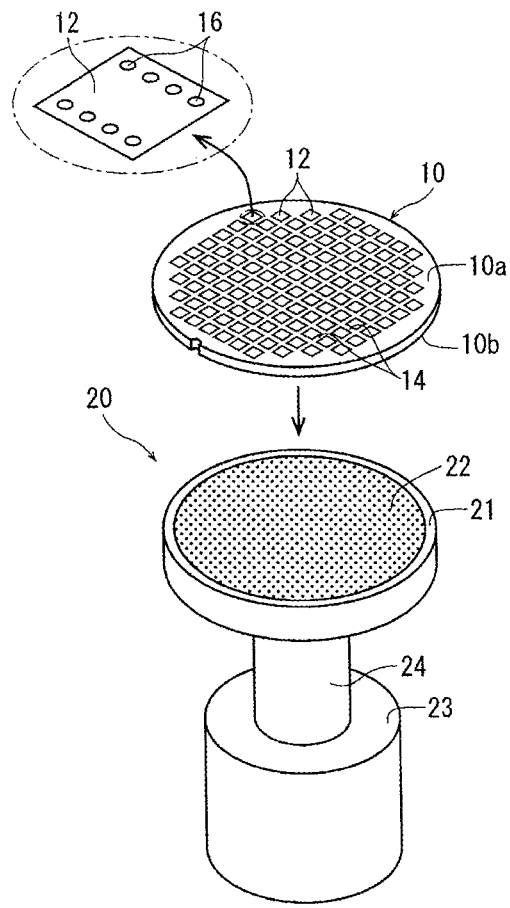
FIG. 1A is a perspective view of a wafer as a workpiece and an apparatus for coating the workpiece with a liquid resin.

FIG. 1A illustrates a wafer 10 to be processed by the method of processing a wafer according to the present embodiment and an apparatus 20, partly illustrated, for coating the wafer 10 with a liquid resin. The wafer 10 is a silicon wafer, for example. The wafer 10 has a plurality of devices 12 formed in respective areas on a face side 10a of the wafer 10, the areas being demarcated by a plurality of intersecting projected dicing lines 14. Each of the devices 12 has a plurality of bumps 16 on its face side, as illustrated at an enlarged scale in an upper inset in FIG. 1A. The bumps 16 are protrusive electrodes for electric connection to outer circuits, and are made of an alloy of lead and tin as major components, for example.

In the method of processing a wafer according to the present embodiment, a resin applying step is initially carried out to coat the face side 10a of the wafer 10 with a liquid resin L to be described below and cover an area of the wafer 10 where the plurality of devices 12 are present. Specifically, the wafer 10 is delivered to the apparatus 20 for coating the wafer 10 with the liquid resin L. The apparatus 20 includes at least a chuck table 21 and a support base 23. The chuck table 21 has an upper holding surface 22 made of an air-permeable porous material. The chuck table 21 is connected to suction means, not illustrated, that, when actuated, generates and transmits a negative pressure to the holding surface 22. The support base 23 houses therein an electric motor, not illustrated, for rotating a rotational shaft 24 about its central axis to rotate the chuck table 21 that is mounted on an upper end of the rotational shaft 24.

The wafer 10 delivered to the apparatus 20 is placed on the chuck table 21 while the face side 10a of the wafer 10 is facing upwardly and a reverse side 10b thereof is facing downwardly, and then, the suction means connected to the chuck table 21 is actuated to hold the wafer 10 on the holding surface 22 under the negative pressure applied to the holding surface 22.

Figure 1B:
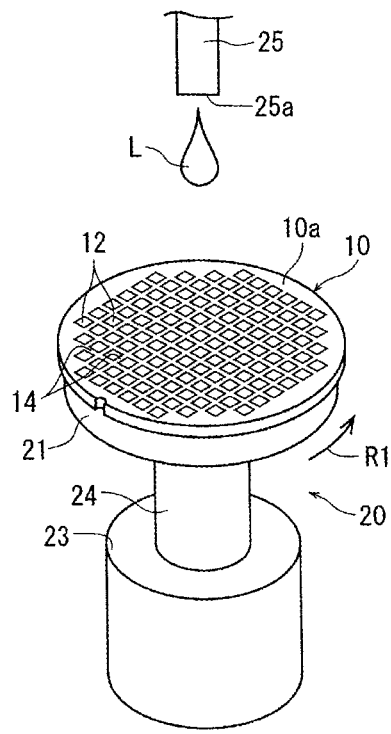
FIG. 1B is a perspective view illustrating the manner in which a resin applying step is carried out.

When the wafer 10 has been held under suction on the chuck table 21, as illustrated in FIG. 1B, a liquid resin supply nozzle 25 is positioned immediately above the center of the wafer 10, and the electric motor housed in the support base 23 is energized to rotate the rotational shaft 24 and the chuck table 21 about their central axis in the direction indicated by an arrow R1. Then, the liquid resin supply nozzle 25 supplies a predetermined amount of liquid resin L from an ejection port 25a to the wafer 10 to coat the face side 10a of the wafer 10. The liquid resin L is, for example, an epoxy resin that is curable upon exposure to ultraviolet rays. The liquid resin supply nozzle 25 may supply the liquid resin L from the ejection port 25a in a single spurt or a plurality of successive spurts. The amount of liquid resin L supplied from the ejection port 25a to the wafer 10 is set to a level that should be enough for the liquid resin L applied to the face side 10a to cover an area of the wafer 10 where the devices 12 are present. The resin applying step is now completed.

Figure 2:
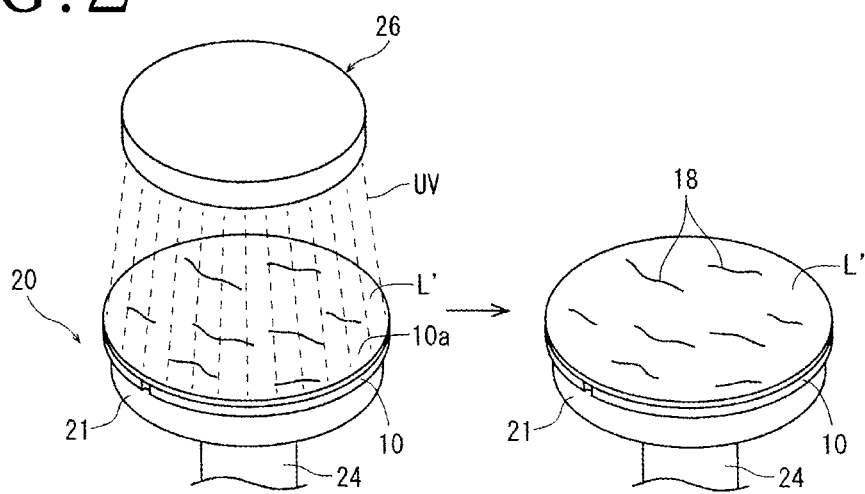
FIG. 2 is a perspective view illustrating the manner in which a resin curing step is carried out.

Then, a resin curing step is carried out to cure the liquid resin L applied to the wafer 10. For carrying out the resin curing step, ultraviolet ray applying means 26 illustrated in a left section of FIG. 2 is positioned immediately above the wafer 10 held by the apparatus 20. Then, the ultraviolet ray applying means 26 applies ultraviolet rays UV to the liquid resin L that has coated the wafer 10. When exposed to the applied ultraviolet rays UV, the liquid resin L is cured, forming a protective film L' on the face side 10a of the wafer 10 as illustrated in a right section of FIG. 2. The resin curing step is now completed. According to the present embodiment, a resin that is curable upon exposure to the ultraviolet rays UV is selected as the liquid resin L on the face side 10a of the wafer 10. However, the liquid resin L may be a resin that is curable over time, for example. If the liquid resin L is a resin that is curable over time, then the resin applying step is followed by a standby step, as the resin curing step, where the wafer 10 is left on the chuck table 21 until the liquid resin L applied to the wafer 10 is cured.

The protective film L' has been formed to a thickness sufficiently large to embed the bumps 16 on the devices 12. As a whole, the protective film L' that contains the bumps 16 tends to have surface irregularities 18 because the protective film L' has thickness irregularities due to surface irregularities on the face side 10a of the wafer 10 and shrinkage caused when the liquid resin L is cured into the protective film L'. Although an attempt may be made to hold the protective film L' in position and grind the reverse side 10b of the wafer 10 to thin down the wafer 10, the wafer 10 may possibly be broken or damaged owing to the surface irregularities 18. According to the present embodiment, a protective tape laying step of laying a protective tape on the upper surface of the protective film L' and a planarizing step of planarizing a face side of the protective tape are carried out.

Figure 3:
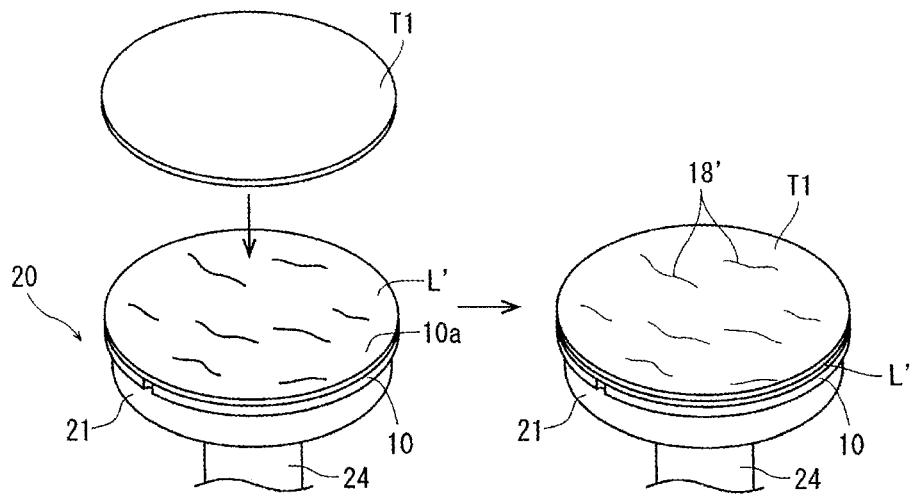
FIG. 3 is a perspective view illustrating the manner in which a protective tape laying step is carried out.

Before the protective tape laying step is carried out, a protective tape T1 illustrated in FIG. 3 is prepared. The protective tape T1 is, for example, a backgrinding tape for use in a grinding step on wafers. The backgrinding tape is made of, for example, a material selected from polyethylene terephthalate (PET), ethylene-vinyl acetate copolymer (EVA), a combination thereof, etc., and has an adhesive on a side thereof that is to be affixed to the protective film L'.

In the protective tape laying step, as illustrated in FIG. 3, the protective tape T1 is laid on an upper surface of the cured liquid resin L, i.e., the protective film L', on the face side 10a of the wafer 10. The protective tape T1 should preferably be laid on the protective film L' in an evacuated vacuum environment so as not to leave air, etc., trapped between the protective film L' and the protective tape T1. When the protective tape T1 has been laid on the protective film L' in intimate contact therewith, surface irregularities 18' are formed on the protective tape T1 due to the surface irregularities 18 on the protective film L' and thickness variations of the protective tape T1, as illustrated in a right section of FIG. 3. According to the present embodiment, a planarizing step is carried out to planarize the protective tape T1 laid on the protective film L', by cutting the protective tape T1.

Figure 4:
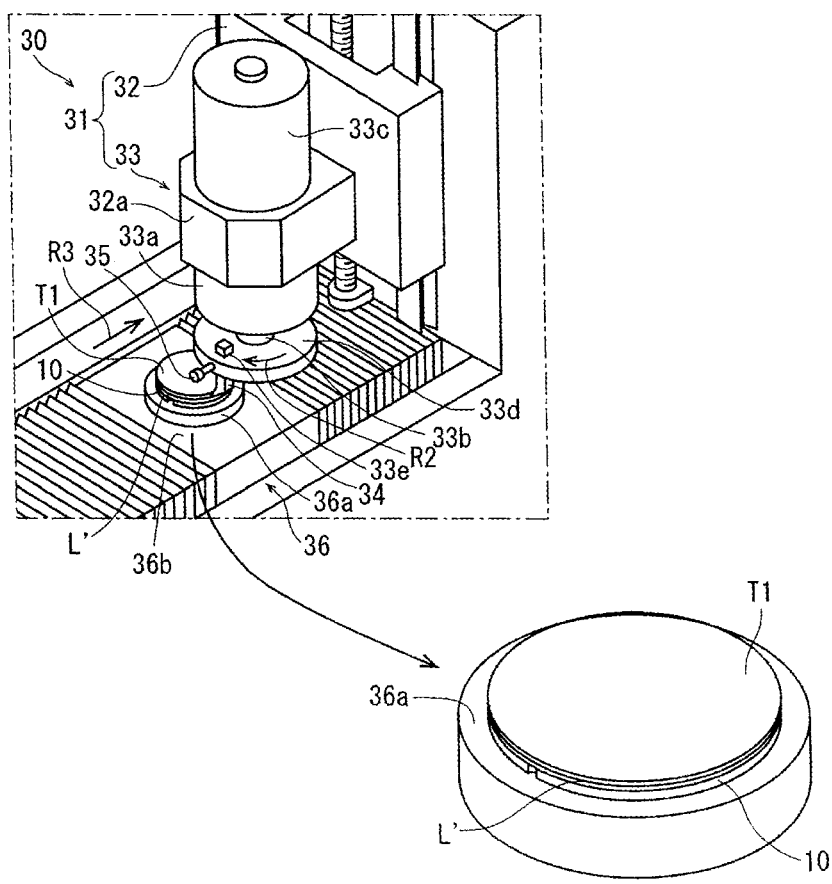
FIG. 4 is a perspective view illustrating the manner in which a planarizing step is carried out.

FIG. 4 illustrates in perspective a cutting apparatus 30, partly illustrated, that is suitable for carrying out the planarizing step. As illustrated in FIG. 4, the cutting apparatus 30 includes a cutting unit 31 mounted on an apparatus body for vertical movement. The cutting unit 31 includes a movable base 32 movable vertically by a cutting feed mechanism, not illustrated, and a spindle unit 33 mounted on the movable base 32. The spindle unit 33 is supported on the movable base 32 by a support member 32a mounted on a front surface of the movable base 32.

The spindle unit 33 includes a spindle housing 33a mounted on the support member 32a, a rotatable spindle 33b rotatably disposed in the spindle housing 33a, and a servomotor 33c as a rotary actuator for rotating the rotatable spindle 33b about its vertical central axis. The rotatable spindle 33b has a lower end portion protruding downwardly beyond a lower end of the spindle housing 33a. A single-point cutting tool mount 33d shaped as a circular plate is mounted on a lower end of the rotatable spindle 33b.

The single-point cutting tool mount 33d has a tool mount hole 33e defined therein that extends vertically through the single-point cutting tool mount 33d in an outer circumferential portion thereof that is spaced radially outwardly from the central axis of the rotatable spindle 33b. A single-point cutting tool 34 is inserted in the tool mount hole 33e and fastened in position by a fastening bolt 35 that is threaded in an internally threaded hole, not illustrated, defined laterally in the single-point cutting tool mount 33d and that has a tip end pressed against the single-point cutting tool 34. According to the present embodiment, the single-point cutting tool 34 is formed as a bar-shaped cutting tool of tool steel such as a cemented carbide alloy. The single-point cutting tool 34 has, on its lower distal end, a cutting edge made of diamond or the like. The single-point cutting tool 34 mounted on the single-point cutting tool mount 33d is rotatable in unison with the single-point cutting tool mount 33d when the rotatable spindle 33b is rotated by the servomotor 33c.

The cutting apparatus 30 includes a chuck table mechanism 36. The chuck table mechanism 36 includes a rotatable chuck table 36a shaped as a circular plate. The chuck table 36a has an upper holding surface made of an air-permeable porous material and connected to a suction source, not illustrated. The chuck table mechanism 36 includes a moving mechanism, not illustrated, housed in the apparatus body of the cutting apparatus 30. The moving mechanism moves the chuck table 36a together with a cover member 36b in the direction indicated by an arrow R3.

The cutting apparatus 30 illustrated in FIG. 4 is generally constructed as described above. The planarizing step according to the present embodiment that is carried out using the cutting apparatus 30 will be described below.

The wafer 10 is placed and held under suction on the chuck table 36a of the cutting apparatus 30 illustrated in FIG. 4 while the protective tape T1 on the protective film L' is facing upwardly. The servomotor 33c is then energized to rotate the single-point cutting tool mount 33d about its central axis in the direction indicated by an arrow R2, and the cutting feed mechanism, not illustrated, is actuated to lower the single-point cutting tool mount 33d to a predetermined height where the cutting edge of the single-point cutting tool 34 mounted on the single-point cutting tool mount 33d can remove the surface irregularities 18' of the protective tape T1 on the wafer 10. The moving mechanism, not illustrated, is actuated to move the chuck table mechanism 36 in the direction indicated by the arrow R3 in FIG. 4, causing the chuck table 36a with the wafer 10 held thereon to pass through a processing area beneath the single-point cutting tool mount 33d. When the chuck table 36a with the wafer 10 held thereon passes through the processing area, the surface irregularities 18' are removed from the protective tape T1 on the wafer 10 by the single-point cutting tool 34, as illustrated in a lower inset in FIG. 4. The planarizing step is now completed.

According to the present invention, the planarizing step may not necessarily be performed by the cutting apparatus 30 and may be carried out using a polishing apparatus or the like, for example.

The method of processing a wafer according to the present embodiment, which includes the resin applying step, the resin curing step, the protective tape laying step, and the planarizing step described above, makes it possible to favourably perform any of various types of division for dividing the wafer 10 into individual device chips as described below. First division among the various types of division will be described below with reference to FIGS. 5A through 6B, 13A, and 13B.

FIG. 5A illustrates in perspective the wafer 10 with the planarized protective tape T1 laid thereon according to the above method of processing a wafer, and a laser processing apparatus 40 suitable for performing the first division. As illustrated in FIG. 5A, the laser processing apparatus 40 includes, on a base table 40a, a laser applying unit 41 for applying a laser beam to the wafer 10 as a workpiece, i.e., a target to be processed, a holding unit 42 for holding the wafer 10, an image capturing unit 43 for capturing an image of the wafer 10 held by the holding unit 42, a feed mechanism assembly 44 for processing-feeding and indexing-feeding the laser applying unit 41 and the holding unit 42 relatively to each other and moving the image capturing unit 43 and the holding unit 42 relatively to each other, and a frame 45 including a vertical wall 45*a* erected from the base table 40*a* behind the feed mechanism assembly 44 and a horizontal wall 45*b* extending horizontally from an upper end portion of the vertical wall 45*a*.

The horizontal wall 45*b* of the frame 45 houses therein an optical system, not illustrated, of the laser applying unit 41. The laser applying unit 41 includes a beam condenser 41*a* disposed on the lower surface of a distal end portion of the horizontal wall 45*b*. The beam condenser 41*a* is movable in Z-axis directions, i.e., vertical directions, indicated by an arrow Z. The image capturing unit 43 is disposed on the lower surface of the distal end portion of the horizontal wall 45*b* at a position adjacent to the beam condenser 41*a* in X-axis directions, i.e., horizontal directions, indicated by an arrow X. The image capturing unit 43 includes an ordinary visible-light image capturing device such as a charge-coupled device (CCD) for capturing images based on a visible light beam, infrared ray applying means for applying infrared rays to a workpiece, an optical system for capturing infrared rays emitted from the infrared ray applying means, and an image capturing device such as an infrared CCD for outputting an electric signal representing the infrared rays captured by the optical system.

As illustrated in FIG. 5A, the holding unit 42 includes a rectangular X-axis movable plate 42*a* movably mounted on the base table 40*a* for movement in the X-axis directions, a rectangular Y-axis movable plate 42*b* movably mounted on the X-axis movable plate 42*a* for movement in Y-axis directions, i.e., horizontal directions, that are perpendicular to the X-axis directions, a hollow cylindrical support post 42*c* fixedly mounted on an upper surface of the Y-axis movable plate 42*b*, and a rectangular cover plate 42*d* fixedly mounted on an upper end of the support post 42*c*. The cover plate 42*d* has an oblong hole defined therein that accommodates therein a chuck table 42*e* extending upwardly. The chuck table 42*e* is rotatable about its vertical central axis by rotary actuating means, not illustrated, housed in the support post 42*c*. The chuck table 42*e* includes a suction chuck 42*f* in the shape of a circular plate that is made of an air-permeable porous material and that is lying essentially horizontally. The suction chuck 42*f* is fluidly connected to suction means, not illustrated, by a fluid channel extending through the support post 42*c*.

The feed mechanism assembly 44 includes an X-axis feed mechanism 46 and a Y-axis feed mechanism 47. The X-axis feed mechanism 46 converts rotary motion of an electric motor 46*a* into linear motion with a ball screw 46*b* and transmits the linear motion to the X-axis movable plate 42*a*, thereby processing-feeding the X-axis movable plate 42*a* in one of the X-axis directions or the other along a pair of guide rails 40*b* that are disposed on the base table 40*a* and that extend in the X-axis directions. The Y-axis feed mechanism 47 converts rotary motion of an electric motor 47*a* into linear motion with a ball screw 47*b* and transmits the linear motion to the Y-axis movable plate 42*b*, thereby indexing-feeding the Y-axis movable plate 42*b* in one of the Y-axis directions or the other along a pair of guide rails 42*g* that are disposed on the X-axis movable plate 42*a* and that extend in the Y-axis directions.

The laser processing apparatus 40 illustrated in FIG. 5A is generally constructed as described above. A modified layer forming step of the first division, which is carried out using the laser processing apparatus 40, will be described in detail below.

First, as illustrated in FIG. 5A, the wafer 10 is placed and held under suction on the suction chuck 42*f* of the chuck table 42*e* while the protective tape T1 formed on the face side 10*a* is facing downwardly and the reverse side 10*b* is facing upwardly.

The feed mechanism assembly 44 is actuated to move the wafer 10 held on the chuck table 42*e* to a position directly below the image capturing unit 43. When the wafer 10 reaches the position directly below the image capturing unit 43, the image capturing unit 43 captures an image of the wafer 10. Specifically, the image capturing unit 43 is electrically connected to a control unit and a display unit, not illustrated. The image capturing unit 43 applies infrared rays to the reverse side 10*b* of the wafer 10 on the chuck table 42*e* and captures an image of the wafer 10. The control unit then detects, from the captured image, one of the projected dicing lines 14 to which a laser beam is to be applied on the face side 10*a*. The control unit then stores the X and Y coordinates representing the positional information of the detected projected dicing line 14, and performs alignment processing for turning the chuck table 42*e* to bring the detected projected dicing line 14 into alignment with the X-axis directions.

After the alignment processing, the X-axis feed mechanism 46 is actuated to move the chuck table 42*e* in one of the X-axis directions and position the detected projected dicing line 14 of the wafer 10 directly below the beam condenser 41*a* of the laser applying unit 41, as illustrated in FIG. 5B. Then, at the same time that the X-axis feed mechanism 46 is actuated to processing-feed the chuck table 42*e* in the X-axis direction, the beam condenser 41*a* is moved in one of the Z-axis directions to position a focused spot P1 of a laser beam LB1 whose wavelength is transmittable through the wafer 10 within the wafer 10, and the laser applying unit 41 emits and applies the laser beam LB1 to the reverse side 10*b* of the wafer 10, thereby forming a modified layer 100 in the wafer 10 along the detected projected dicing line 14 that extends in a first direction, as illustrated in FIG. 5C. After the modified layer 100 has been formed in the wafer 10 along the projected dicing line 14, the Y-axis feed mechanism 47 is actuated to indexing-feed the chuck table 42*e* in one of the Y-axis directions by a distance equal to the interval between adjacent projected dicing lines 14 and to position, directly below the beam condenser 41*a* of the laser applying unit 41, a next projected dicing line 14 where no modified layer 100 has been formed. Then, at the same time that the X-axis feed mechanism 46 is actuated to processing-feed the chuck table 42*e* in one of the X-axis directions, the beam condenser 41*a* is moved in one of the Z-axis directions to position the focused spot P1 of the laser beam LB1 within the wafer 10, and the laser applying unit 41 emits and applies the laser beam LB1 to the reverse side 10*b* of the wafer 10, thereby forming a modified layer 100 in the wafer 10 along the next projected dicing line 14 that extends in the first direction.

The above laser processing sequence is repeated to processing-feed the wafer 10 in one of the X-axis directions and indexing-feed the wafer 10 in one of the Y-axis directions, and to apply the laser beam LB1 to the wafer 10 while the wafer 10 is being processing-fed in the X-axis direction, thereby forming modified layers 100 in the wafer 10 along all the projected dicing lines 14 that extend in the first direction. Then, the wafer 10 is turned 90 degrees to align, with the X-axis directions, all the projected dicing lines 14 that extend in a second direction perpendicular to the first direction and that have not undergone the processing. Thereafter, the above laser processing sequence is repeated to form modified layers 100 in the wafer 10 along all the projected dicing lines 14 that extend in the second direction.

In this manner, the modified layers 100 are formed in the wafer 10 along all the projected dicing lines 14 established on the face side 10a of the wafer 10. The modified layer forming step is now completed.

Laser processing conditions in the modified layer forming step are set as follows, for example.

Figure 6A:
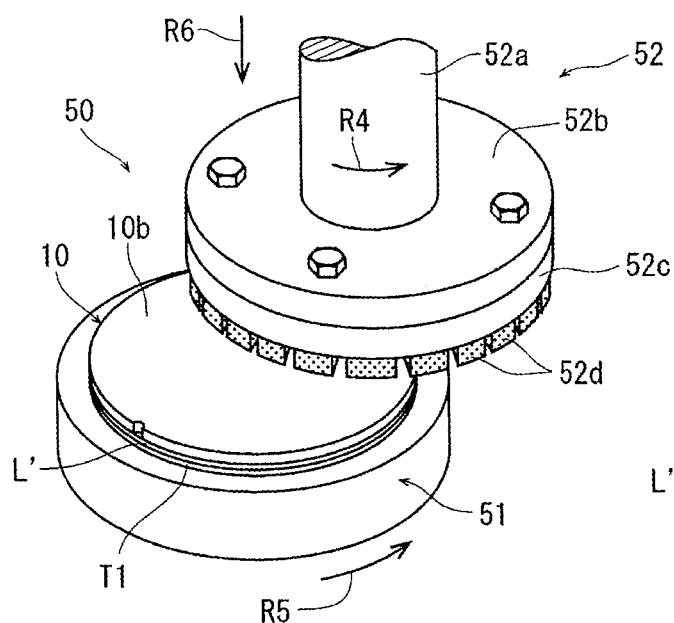
FIG. 6A is a perspective view illustrating the manner in which a dividing step of dividing the wafer into individual device chips at modified layers is carried out.

Wavelength: 1342 nm
Average output power: 1.0 W
Repetitive frequency: 90 kHz
Feed speed: 700 mm/second After the modified layer forming step, the wafer 10 is delivered to a grinding apparatus 50 (partly illustrated) illustrated in FIG. 6A to perform a dividing step. As illustrated in FIG. 6A, the grinding apparatus 50 includes a chuck table 51 that is rotatable about its central axis by rotary actuating means, not illustrated, and a grinding unit 52. The grinding unit 52 includes a rotatable spindle 52a that is rotatable by rotary actuating means, not illustrated, a wheel mount 52b mounted on a lower end of the rotatable spindle 52a, and a grinding wheel 52c attached to a lower surface of the wheel mount 52b. A plurality of grindstones 52d are mounted in an annular array on a lower surface of the grinding wheel 52c.

Figure 6B:
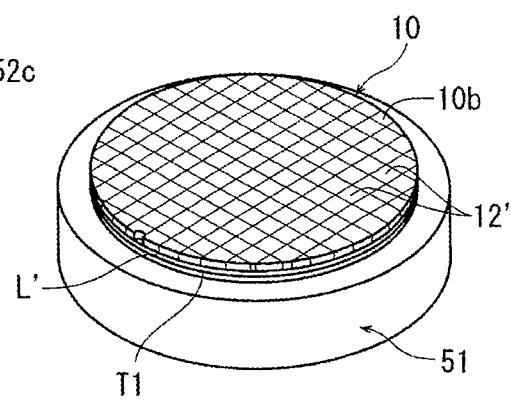
FIG. 6B is a perspective view illustrating the wafer that has been divided into individual device chips in the dividing step illustrated in FIG. 6A.

As illustrated in FIG. 6A, the wafer 10 delivered to the grinding apparatus 50 is held under suction on the chuck table 51 while the protective tape T1 formed on the face side 10a is facing downwardly and the reverse side 10b is facing upwardly. Then, the rotatable spindle 52a of the grinding unit 52 is rotated about its central axis in the direction indicated by an arrow R4 at a speed of 6000 rpm, for example, and the chuck table 51 is rotated about its central axis in the direction indicated by an arrow R5 at a speed of 300 rpm, for example. Then, a grinding feed mechanism, not illustrated, coupled to the grinding unit 52 is actuated to lower the grinding unit 52 in the direction indicated by an arrow R6, bringing the grindstones 52d into abrasive contact with the reverse side 10b of the wafer 10. After the grindstones 52d have been brought into abrasive contact with the reverse side 10b of the wafer 10, the grinding feed mechanism grinding-feeds, i.e., lowers, the grinding unit 52 at a grinding feed speed of 1 μm/second, for example. The wafer 10 is ground by the grindstones 52d while the thickness thereof is being measured by a contact-type thickness measuring gage, not illustrated, so that the wafer 10 can be ground to a predetermined finish thickness. Then, external forces are exerted on the ground wafer 10 to divide the wafer 10 into individual device chips 12' along the modified layers 100 formed in the wafer 10 along the projected dicing lines 14, as illustrated in FIG. 6B. At this point, the dividing step comes to an end. The first division is now completed.

Figure 13A:
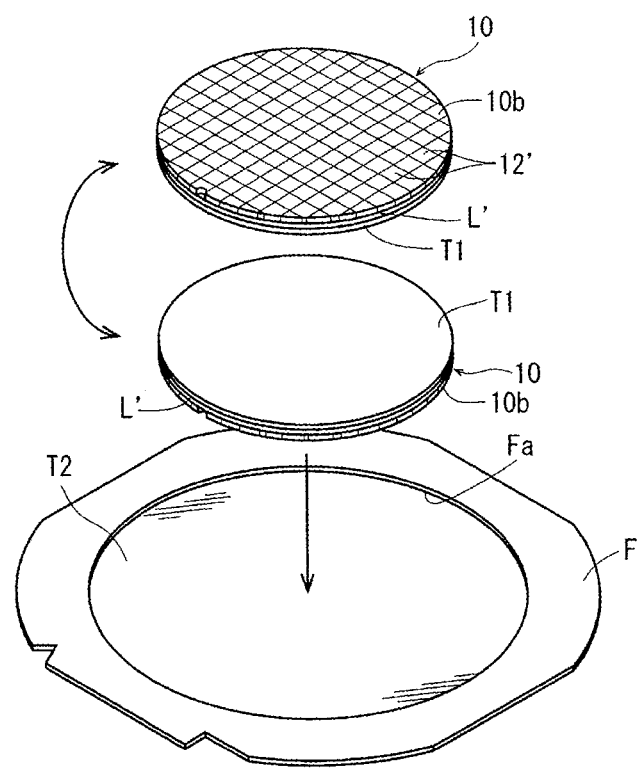
FIG. 13A is a perspective view illustrating the manner in which the wafer that has been divided into individual device chips is held by an annular frame.
Figure 13B:
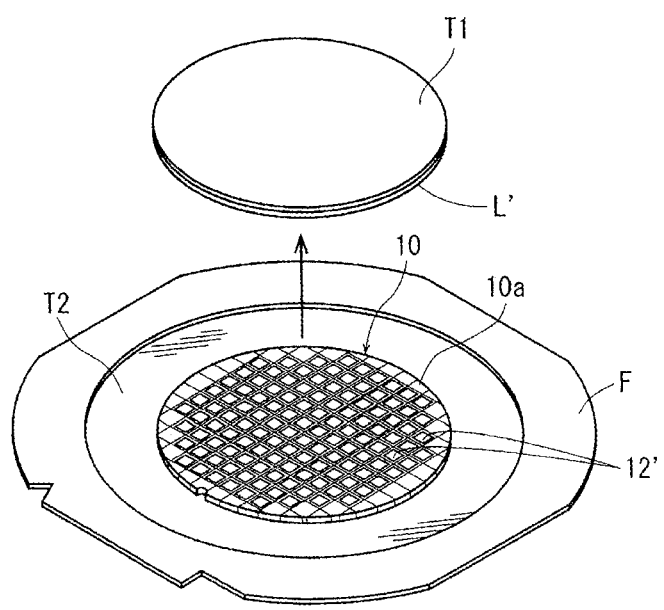
FIG. 13B is a perspective view illustrating the manner in which a protective film is removed from the wafer.

After the wafer 10 has been divided into individual device chips 12' in the first division as described above, the wafer 10 is then sent to a picking-up step, not illustrated, when required. In the picking-up step, as illustrated in FIG. 13A, an annular frame F having an opening Fa capable of accommodating the wafer 10 therein is prepared, and the wafer 10 is turned upside down to orient the protective tape T1 formed on the face side 10a upwardly and to orient the reverse side 10b downwardly and is positioned centrally in the opening Fa. The wafer 10 is held by the annular frame F through an adhesive tape T2 applied to both of them and interposed therebetween. Then, as illustrated in FIG. 13B, the protective tape T1 and the protective film L' are removed from the wafer 10, exposing the face side 10a of the wafer 10 that has been divided into the individual device chips 12', so that the individual device chips 12' can readily be picked up.

The first division is carried out after the resin applying step, the resin curing step, the protective tape laying step, and the planarizing step have been carried out. Therefore, even if protrusions such as the bumps 16 are present on the face sides of the devices 12, those protrusions are embedded by the liquid resin L. The face side of the protective tape T1 that covers the protective film L' is planarized to eliminate the effects of the surface irregularities 18 of the protective film L' and the undulations due to the thickness variations of the protective tape T1. The reverse side 10b of the wafer 10 can thus be ground by the grindstones to divide the wafer 10 into the individual device chips 12' without causing damage to the wafer 10.

The various types of division referred to above include second division that can be carried out in combination with the method of processing a wafer that includes the resin applying step, the resin curing step, the protective tape laying step, and the planarizing step. The second division will be described below with reference to FIGS. 7 through 10.

Figure 7:
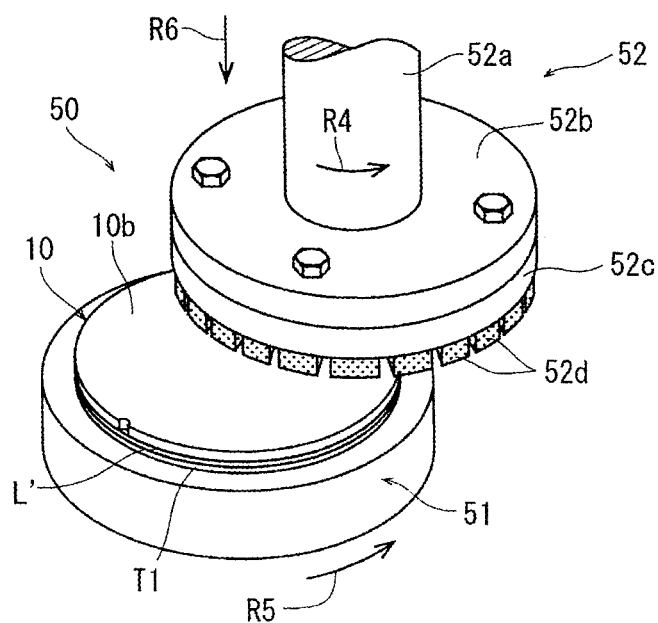
FIG. 7 is a perspective view illustrating the manner in which a grinding step of grinding a reverse side of the wafer with grindstones is carried out.

In the second division, the method of processing a wafer that includes the resin applying step, the resin curing step, the protective tape laying step, and the planarizing step is performed on the wafer 10. No modified layer forming step has been carried out on the wafer 10, and the wafer 10 with the protective tape T1 laid on the protective film L' is delivered to the grinding apparatus 50 described above with reference to FIGS. 6A and 6B to perform a grinding step. As illustrated in FIG. 7, the wafer 10 delivered to the grinding apparatus 50 is held under suction on the chuck table 51 while the protective tape T1 is facing downwardly and the reverse side 10b is facing upwardly. Then, the rotatable spindle 52a of the grinding unit 52 is rotated about its central axis in the direction indicated by the arrow R4 at a speed of 6000 rpm, for example, and the chuck table 51 is rotated about its central axis in the direction indicated by the arrow R5 at a speed of 300 rpm, for example. Then, the grinding feed mechanism, not illustrated, coupled to the grinding unit 52 is actuated to lower the grinding unit 52 in the direction indicated by the arrow R6, bringing the grindstones 52d into abrasive contact with the reverse side 10b of the wafer 10. After the grindstones 52d have been brought into abrasive contact with the reverse side 10b of the wafer 10, the grinding feed mechanism grinding-feeds, i.e., lowers, the grinding unit 52 at a grinding feed speed of 1 μm/second, for example. The wafer 10 is ground by the grindstones 52d while the thickness thereof is being measured by a contact-type thickness measuring gage, not illustrated, so that the wafer 10 can be ground to a predetermined finish thickness. At this point, the grinding step is ended.

Figure 8A:
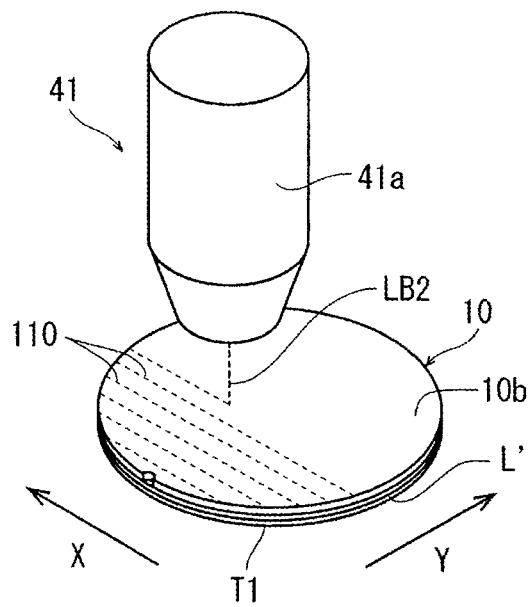
FIG. 8A is a perspective view illustrating the manner in which a modified layer forming step is carried out on the wafer ground in the grinding step illustrated in FIG. 6A.
Figure 8B:
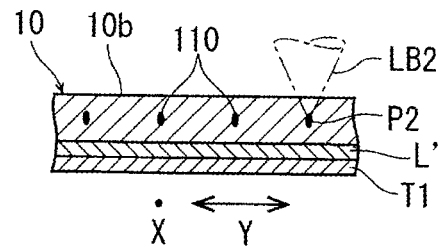
FIG. 8B is an enlarged fragmentary cross-sectional view of the wafer illustrated in FIG. 8A.
Figure 9:
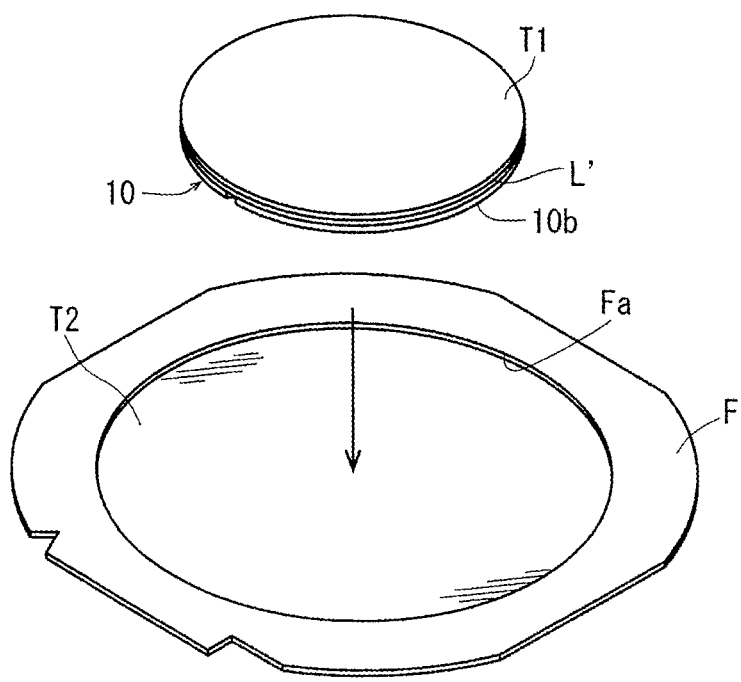
FIG. 9 is a perspective view illustrating the manner in which the wafer that has been undergone the modified layer forming step illustrated in FIG. 8A is held by an annular frame.

After the wafer 10 has been ground to a predetermined finish thickness in the grinding step, the wafer 10 is delivered to the laser processing apparatus 40 described above with reference to FIGS. 5A through 5C to perform the modified layer forming step. The wafer 10 is placed and held under suction on the suction chuck 42f of the chuck table 42e while the protective film L' formed on the face side 10a is facing downwardly and the reverse side 10b is facing upwardly. The alignment processing described above is performed on the wafer 10, and then, the X-axis feed mechanism 46 is actuated to move the chuck table 42e in one of the X-axis directions and position one of the projected dicing lines 14 of the wafer 10 directly below the beam condenser 41a of the laser applying unit 41, as illustrated in FIG. 8A. Then, at the same time that the X-axis feed mechanism 46 is actuated to processing-feed the chuck table 42e in the X-axis direction, the beam condenser 41a is moved in one of the Z-axis directions to position a focused spot P2 of a laser beam LB2 whose wavelength is transmittable through the wafer 10 within the wafer 10, and the laser applying unit 41 emits and applies the laser beam LB2 to the reverse side 10b of the wafer 10, thereby forming a modified layer 110 in the wafer 10 along the projected dicing line 14 that extends in a first direction, as illustrated in FIG. 8B. After the modified layer 110 has been formed in the wafer 10 along the projected dicing line 14, the Y-axis feed mechanism 47 is actuated to indexing-feed the chuck table 42e in one of the Y-axis directions by a distance equal to the interval between adjacent projected dicing lines 14 and to position, directly below the beam condenser 41a of the laser applying unit 41, a next projected dicing line 14 where no modified layer 110 has been formed. Then, at the same time that the X-axis feed mechanism 46 is actuated to processing-feed the chuck table 42e in one of the X-axis directions, the beam condenser 41a is moved in one of the Z-axis directions to position the focused spot P2 of the laser beam LB2 within the wafer 10, and the laser applying unit 41 emits and applies the laser beam LB2 to the reverse side 10b of the wafer 10, thereby forming a modified layer 110 in the wafer 10 along the next projected dicing line 14.

The above laser processing sequence is repeated to processing-feed the wafer 10 in one of the X-axis directions and indexing-feed the wafer 10 in one of the Y-axis directions, and to apply the laser beam LB2 to the wafer 10 while the wafer 10 is being processing-fed in the X-axis direction, thereby forming modified layers 100 in the wafer 10 along all the projected dicing lines 14 that extend in the first direction. Then, the wafer 10 is turned 90 degrees to align, with the X-axis directions, all the projected dicing lines 14 that extend in a second direction perpendicular to the first direction and that have not undergone the processing. Thereafter, the above laser processing sequence is repeated to form modified layers 110 in the wafer 10 along all the projected dicing lines 14 that extend in the second direction. In this manner, the modified layers 100 are formed in the wafer 10 along all the projected dicing lines 14 established on the face side 10a of the wafer 10. The modified layer forming step is now completed.

Figure 10:
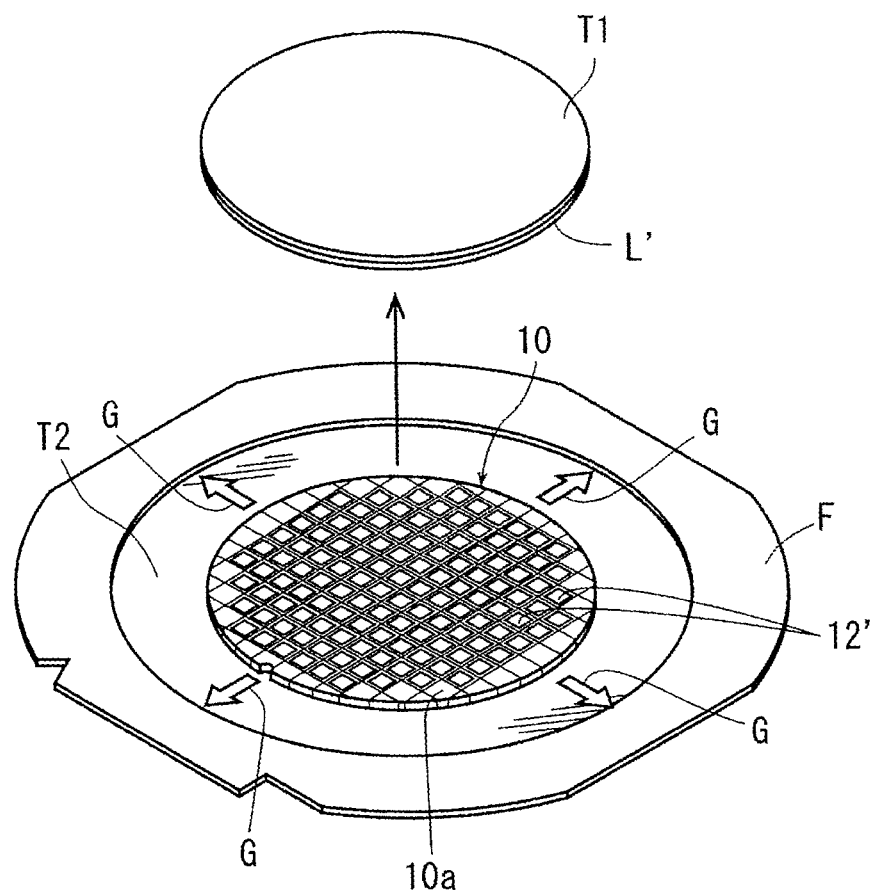
FIG. 10 is a perspective view illustrating the manner in which a dividing step of dividing the wafer into individual device chips by exerting external forces on the wafer is carried out.

Laser processing conditions in the modified layer forming step of the second division are set as follows, for example.
  Wavelength: 1064 nm
  Average output power: 1.0 W
  Repetitive frequency: 80 kHz
  Feed speed: 300 mm/second After the modified layer forming step, the wafer 10 is delivered from the laser processing apparatus 40. Then, as illustrated in FIG. 10, an annular frame F having an opening Fa capable of accommodating the wafer 10 therein is prepared for performing a dividing step, and the wafer 10 is held by the annular frame F through an adhesive tape T2 applied to both of them and interposed therebetween while the protective tape T1 is facing upwardly and the reverse side 10b is facing downwardly. Then, as illustrated in FIG. 10, the protective film L' and the protective tape T1 are removed from the face side 10a of the wafer 10. After the protective film L' and the protective tape T1 have been removed from the face side 10a of the wafer 10, external forces G are exerted radially outwardly on the wafer 10 to pull the adhesive tape T2 in radially outward directions, dividing the wafer 10 into individual device chips 12' along the modified layers 110 that act as division initiating points. At this point, the dividing step is ended. The second division is now completed.

The second division offers the same advantages as with the first division because the resin applying step, the resin curing step, the protective tape laying step, and the planarizing step have already been carried out. Accordingly, the wafer 10 can well be divided into individual device chips 12' in the second division.

The various types of division referred to above include third division for dividing the wafer 10 into individual device chips. The third division that can be carried out in combination with the method of processing a wafer that includes the resin applying step, the resin curing step, the protective tape laying step, and the planarizing step will be described below with reference to FIGS. 11A through 13B.

In the division, prior to the resin applying step, a groove forming step is carried out to form grooves in the wafer 10 along the projected dicing lines 14 established on the face side 10a of the wafer 10. Specifically, the wafer 10 is delivered to a cutting apparatus 60 (partly illustrated) illustrated in FIG. 11A. As illustrated in FIG. 11A, the cutting apparatus 60 includes a chuck table, not illustrated, for holding the wafer 10 under suction thereon and a cutting unit 62 for cutting the wafer 10 held under suction on the chuck table. The chuck table is rotatable about its vertical central axis. The cutting apparatus 60 also includes an X-axis moving mechanism, not illustrated, for processing-feeding the chuck table and hence the wafer 10 held thereon in an X-axis direction indicated by an arrow X. The cutting apparatus 60 further includes a spindle housing 63, a spindle 64 rotatably supported in the spindle housing 63 for rotation about its horizontal central axis extending parallel to a Y-axis direction indicated by an arrow Y, an annular cutting blade 65 having a diameter of 50 mm, for example, and being held on a distal end of the spindle 64, a blade cover 66 covering the cutting blade 65, and a Y-axis moving mechanism, not illustrated, for indexing-feeding the cutting blade 65 in the Y-axis direction. The spindle 64 is rotatable by a spindle motor, not illustrated.

For carrying out the groove forming step according to the present embodiment, the wafer 10 is placed and held under suction on the chuck table of the cutting apparatus 60 with the face side 10a facing upwardly. One of the projected dicing lines 14 of the wafer 10 that extend in a first direction is aligned with the X-axis direction and positioned in alignment with the cutting blade 65. Then, the cutting blade 65 that is rotating at a high speed of 30000 rpm, for example, in the direction indicated by an arrow R7 is positioned in alignment with the projected dicing line 14 aligned with the X-axis direction. Then, the cutting blade 65 is forced to cut into the wafer 10 from the face side 10a to a depth terminating short of the reverse side 10b but reaching at least a finish thickness of the devices 12 while a cutting fluid is supplied to the wafer 10 at a rate of 2 liters/minute, for example, and the chuck table is processing-fed in the X-axis direction at a speed of 50 mm/second, for example, thereby forming a groove 130 in the wafer 10 along the projected dicing line 14, as illustrated in FIG. 11B. Thereafter, the cutting blade 65 of the cutting unit 62 is indexing-fed in the Y-axis direction into alignment with a next projected dicing line 14 where no groove 130 has been formed, the next projected dicing line 14 extending in the first direction and being disposed adjacent to the projected dicing line 14 where the groove 130 has just been formed. Then, the cutting blade 65 cuts into the wafer 10, forming a groove 130 in the wafer 10 along the next projected dicing line 14. The above cutting processing is repeated to form grooves 130 in the wafer 10 along all the projected dicing lines 14 that extend in the first direction. Then, the chuck table is turned 90 degrees to align, with the X-axis direction, one of the projected dicing lines 14 of the wafer 10 that extend in a second direction perpendicular to the first direction, and to position the projected dicing line 14 in alignment with the cutting blade 65. The above cutting processing is repeated to form grooves 130 in the wafer 10 along all the projected dicing lines 14 that extend in the second direction. As illustrated in FIG. 11C, grooves 130 are now formed in all the projected dicing lines 14 established on the face side 10a of the wafer 10. The groove forming step is now completed.

After the groove forming step, the resin applying step, the resin curing step, the protective tape laying step, and the planarizing step described above are carried out. After the planarizing step, the wafer 10 with the protective film L' and the protective tape T1 is delivered to a grinding apparatus 50 illustrated in FIG. 12 to perform a dividing step. The grinding apparatus 50 illustrated in FIG. 12 is identical to the grinding apparatus 50 described above with reference to FIG. 6, and will be omitted from description. The protective tape T1 on the wafer 10 is placed and held under suction on the chuck table 51 of the grinding apparatus 50. As illustrated in FIG. 12, the reverse side 10b of the wafer 10 is ground by the grindstones 52d until the grooves 130 are exposed and the wafer 10 is ground to a finish thickness of the devices 12. As a result, the wafer 10 is divided into individual device chips 12', as illustrated in an upper section of FIG. 13A. The dividing step is now completed.

At the time that the wafer 10 is simply divided into the device chips 12', the wafer 10 still remains integral, retaining its shape, on account of the protective film L' and the protective tape T1 on the face side 10a. As illustrated in FIG. 13A, an annular frame F having an opening Fa capable of accommodating the wafer 10 therein is prepared, and the wafer 10 is turned upside down to orient the protective tape T1 upwardly and to orient the reverse side 10b downwardly and is positioned centrally in the opening Fa. The wafer 10 is held by the annular frame F through an adhesive tape T2 applied to both of them and interposed therebetween. Then, as illustrated in FIG. 13B, the protective film L' and the protective tape T1 are removed from the wafer 10, exposing the face side 10a of the wafer 10 that has been divided into the individual device chips 12', so that the individual device chips 12' can readily be picked up. When the third division is carried out, the resin applying step, the resin curing step, the protective tape laying step, and the planarizing step are also carried out in combination therewith. Since the protective film L' and the protective tape T1 have been uniformized in thickness, when the dividing step is carried out to grind the reverse side 10b of the wafer 10 and divide the wafer 10 into individual device chips 12', the same advantages as those of the first and second division are obtained.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a wafer having a plurality of devices formed in respective areas on a face side of the wafer, the areas being demarcated by a plurality of intersecting projected dicing lines, the method comprising:
   a resin applying step of coating the face side of the wafer with a liquid resin to cover an entire area of the wafer where the plurality of devices are present;
   a resin curing step of curing the liquid resin into a protective film across the entire area of the wafer covering the plurality of devices;
   a protective tape laying step of laying a protective tape on an upper surface of the protective film; and
   a planarizing step of planarizing a face side of the protective tape.

2. The method of processing a wafer according to claim 1, wherein the planarizing step includes the steps of holding a reverse side of the wafer on a chuck table, exposing the face side of the wafer, and cutting the protective tape to planarize the protective tape with a cutting unit having a single-point cutting tool.

3. The method of processing a wafer according to claim 1, further comprising:
   a modified layer forming step of, after the planarizing step, forming modified layers in the wafer along the respective projected dicing lines by applying a laser beam having a wavelength transmittable through the wafer to the wafer from a reverse side of the wafer along the projected dicing lines while positioning a focused spot of the laser beam within the wafer; and
   a dividing step of grinding the reverse side of the wafer with grindstones to finish the wafer to a predetermined thickness and dividing the wafer into individual device chips along the modified layers.

4. The method of processing a wafer according to claim 1, further comprising:
   a grinding step of, after the planarizing step, grinding a reverse side of the wafer with grindstones to finish the wafer to a predetermined thickness;
   a modified layer forming step of forming modified layers in the wafer along the respective projected dicing lines by applying a laser beam having a wavelength transmittable through the wafer to the wafer from the reverse side of the wafer along the projected dicing lines while positioning a focused spot of the laser beam within the wafer; and
   a dividing step of dividing the wafer into individual device chips by exerting external forces to the wafer.

5. The method of processing a wafer according to claim 1, further comprising:
   a groove forming step of, before the resin applying step, forming grooves in the wafer along the respective projected dicing lines on the face side of the wafer,
   wherein the resin applying step, the resin curing step, the protective tape laying step, and the planarizing step are carried out after the groove forming step, and
   a dividing step of grinding a reverse side of the wafer with grindstones to finish the wafer to a predetermined thickness and expose the grooves on the reverse side, to thereby divide the wafer into individual device chips is carried out after the planarizing step.

6. The method of processing a wafer according to claim 1, wherein the resin is applied so as to embed the plurality of devices on the face side of the wafer.

* * * * *